US005703502A

United States Patent [19]
Grewal et al.

[11] Patent Number: 5,703,502
[45] Date of Patent: Dec. 30, 1997

[54] CIRCUITRY THAT DETECTS A PHASE DIFFERENCE BETWEEN A FIRST, BASE, CLOCK AND A SECOND, DERIVATIVE, CLOCK DERIVED FROM THE BASE CLOCK

[75] Inventors: Harsimran S. Grewal, San Francisco; Lawrence R. Yang, Palo Alto, both of Calif.

[73] Assignee: Sun Microsystems, Inc., Mountain View, Calif.

[21] Appl. No.: 652,700

[22] Filed: May 30, 1996

[51] Int. Cl.$^6$ ............................................. H03D 13/00
[52] U.S. Cl. ....................................... 327/3; 327/47
[58] Field of Search ............................... 327/2, 3, 5, 7, 327/8, 9, 12, 18, 26, 39, 40, 41–49, 170, 175, 176, 141, 144–147, 150, 155, 163

[56] References Cited

U.S. PATENT DOCUMENTS

| | | | |
|---|---|---|---|
| 3,826,988 | 7/1974 | Wise et al. | 327/9 |
| 4,379,221 | 4/1983 | Avins et al. | 327/5 |
| 4,849,704 | 7/1989 | Thornton | 327/5 |
| 5,197,086 | 3/1993 | Jackson et al. | 327/144 |
| 5,266,851 | 11/1993 | Nukui | 327/3 |
| 5,555,213 | 9/1996 | DeLong | 327/155 |

FOREIGN PATENT DOCUMENTS

| | | | |
|---|---|---|---|
| 401047127 | 2/1989 | Japan | 327/5 |
| 403141717 | 6/1991 | Japan | 327/3 |
| 404068813 | 3/1992 | Japan | 327/3 |

Primary Examiner—Timothy P. Callahan
Assistant Examiner—My-Trang Nu Ton
Attorney, Agent, or Firm—Limbach & Limbach L.L.P.

[57] ABSTRACT

A phase detection circuit detects a phase relationship between a first clock signal, characterized by transitions of a given polarity (e.g., rising edges) at a first frequency, and a second clock signal, characterized by transitions of the given polarity at a second frequency that is an integer multiple of the first frequency. Transition indication circuitry generates a transition indication signal responsive to transitions, of the given polarity, of the second clock signal. The transition indication signal includes a transition indication (e.g., a pulse) corresponding to each $n^{th}$ transition, of the given polarity, of the second clock signal and at a phase that is selectable relative to the first clock signal in response to a transition indication control signal. Sampling circuitry (e.g., one or more latches) samples the transition indication signal responsive to each transition, of the given polarity, of the first clock signal to generate a transition indication sample. Coincidence determination circuitry determines, responsive to the transition indication sample signal and to the second clock signal, if the transition indication coincides with a transition, of the given polarity, of the second clock signal. Transition indication control circuitry generates the transition indication control signal responsive to the determination by the coincidence determination circuitry. The transition indications of the transition indication signal, when the transition indication signal is at a steady state, provides an indication of the phase relationship between the first clock signal and the second clock signal.

14 Claims, 3 Drawing Sheets 5,703,502

1

CIRCUITRY THAT DETECTS A PHASE DIFFERENCE BETWEEN A FIRST, BASE, CLOCK AND A SECOND, DERIVATIVE, CLOCK DERIVED FROM THE BASE CLOCK

TECHNICAL FIELD

The present invention relates to circuitry for detecting a phase relationship between a first, fast clock and a second, slow clock. In particular, the present invention relates to circuitry for processing the fast clock and the slower clock to generate an indication of the phase relationship between the fast clock and the slow clock so that circuits that use the fast clock can be synchronized to circuits that use the slow clock.

BACKGROUND

Many complex integrated circuits ("CIC's") employ multiple clocks. Often, "fast circuits", such as circuits internal to the IC's, run at a high speed responsive to a fast clock, and "slow circuits", such as interface circuits that connect various IC's together, run at a slower speed, responsive to a slow clock. One way to distribute clocks among the fast circuits and the slow circuits is to generate a slow clock, and derive the fast clock from the slow clock, or vice versa.

However, the phase relationship between the slow clock and the fast clock must be known so that the fast circuits can communicate in a synchronous fashion with the slow circuits. For example, FIG. 1 shows a fast clock 10 and a slow clock 12, where each rising edge of the slow clock 12 matches a rising edge of the fast clock 10.

SUMMARY

A phase detection circuit detects a phase relationship between a first clock signal, characterized by transitions of a given polarity (e.g., rising edges) at a first frequency, and a second clock signal, characterized by transitions of the given polarity at a second frequency that is an integer multiple of the first frequency. Transition indication circuitry generates a transition indication signal responsive to transitions, of the given polarity, of the second clock signal. The transition indication signal includes a transition indication (e.g., a pulse) corresponding to each $n^{th}$ transition, of the given polarity, of the second clock signal and at a phase that is selectable relative to the first clock signal in response to a transition indication control signal.

Sampling circuitry (e.g., one or more latches) samples the transition indication signal responsive to each transition, of the given polarity, of the first clock signal to generate a transition indication sample. Coincidence determination circuitry determines, responsive to the transition indication sample signal and to the second clock signal, if the transition indication coincides with a transition, of the given polarity, of the second clock signal.

Transition indication control circuitry generates the transition indication control signal responsive to the determination by the coincidence determination circuitry. The transition indications of the transition indication signal, when the transition indication signal is at a steady state, provides an indication of the phase relationship between the first clock signal and the second clock signal.

2

Figure 2:
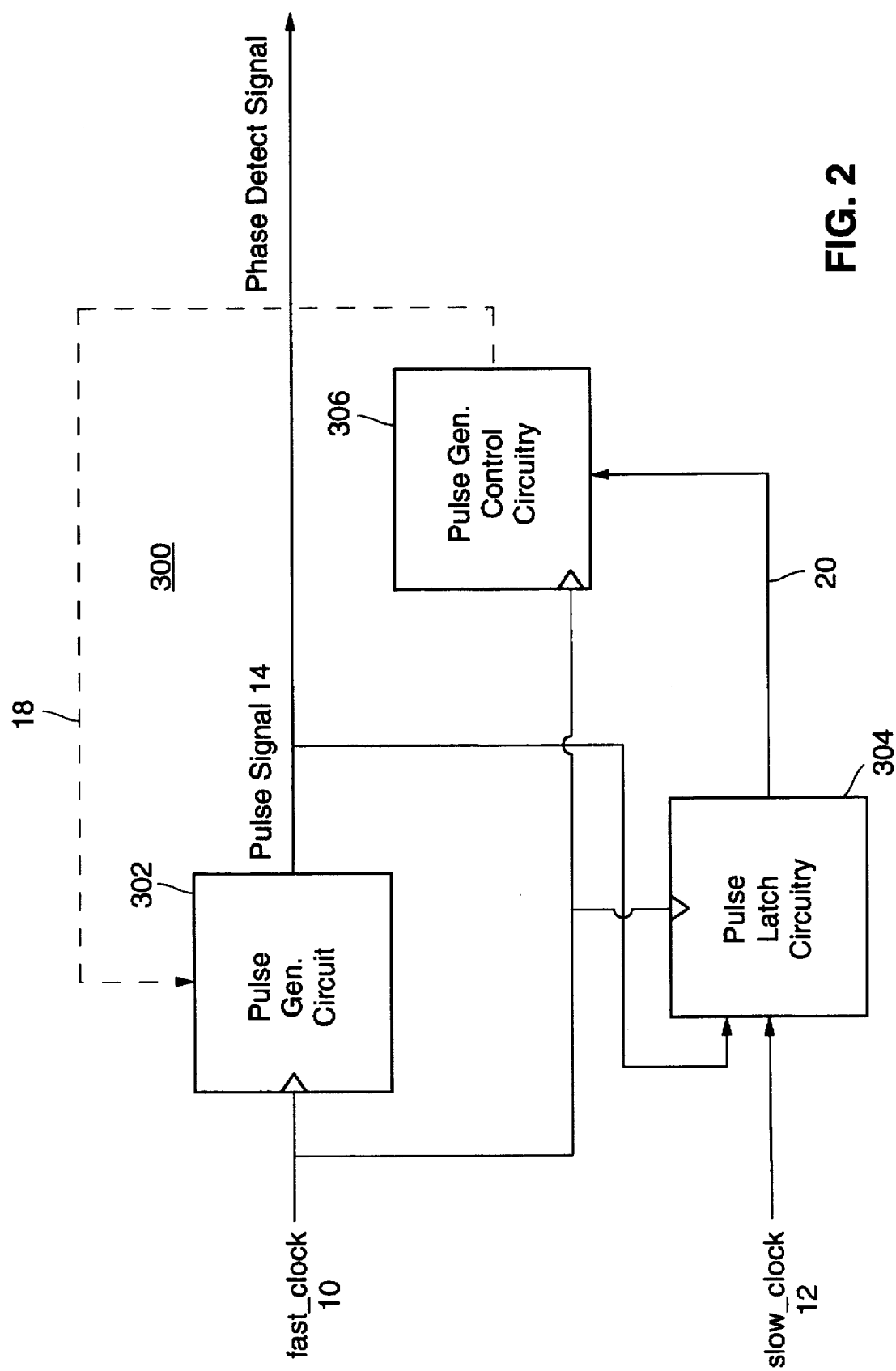

FIG. 2 is a block diagram of a phase detection circuit 300 in accordance with one embodiment of the invention.

Figure 1:
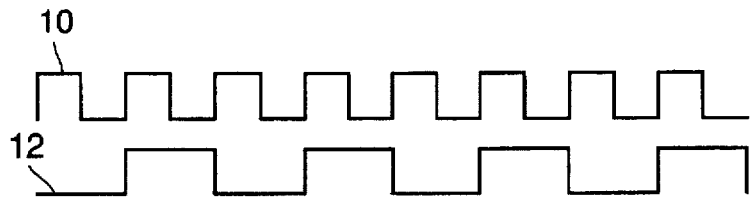
FIG. 1 is a timing diagram that shows a fast clock 10 and a slow clock 12, where each rising edge of the slow clock 12 matches a rising edge of the fast clock 10.
Figure 3:
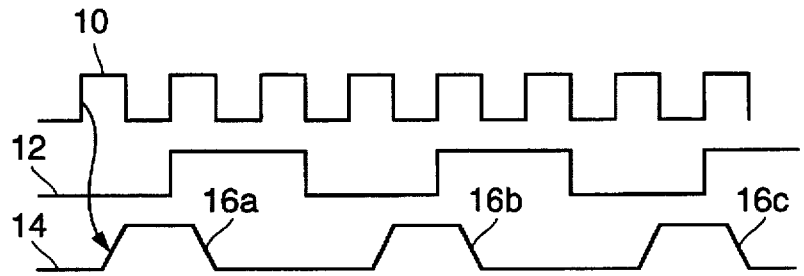

FIG. 3 is a timing diagram that illustrates the operation of the phase detection circuit 300.

Figure 4:
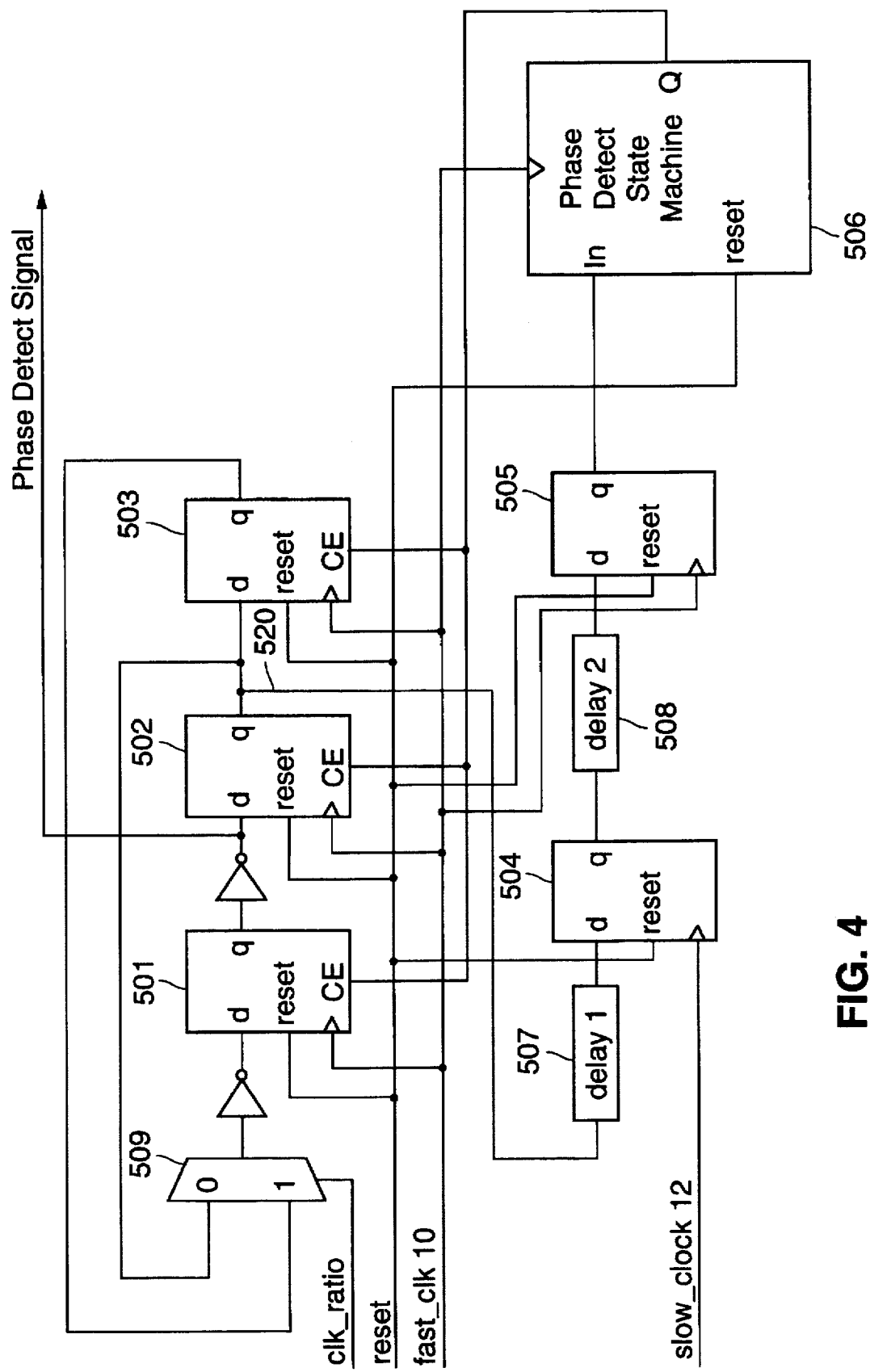

FIG. 4 schematically illustrates a detailed embodiment 500 of the phase detection circuit 300.

Figure 5:
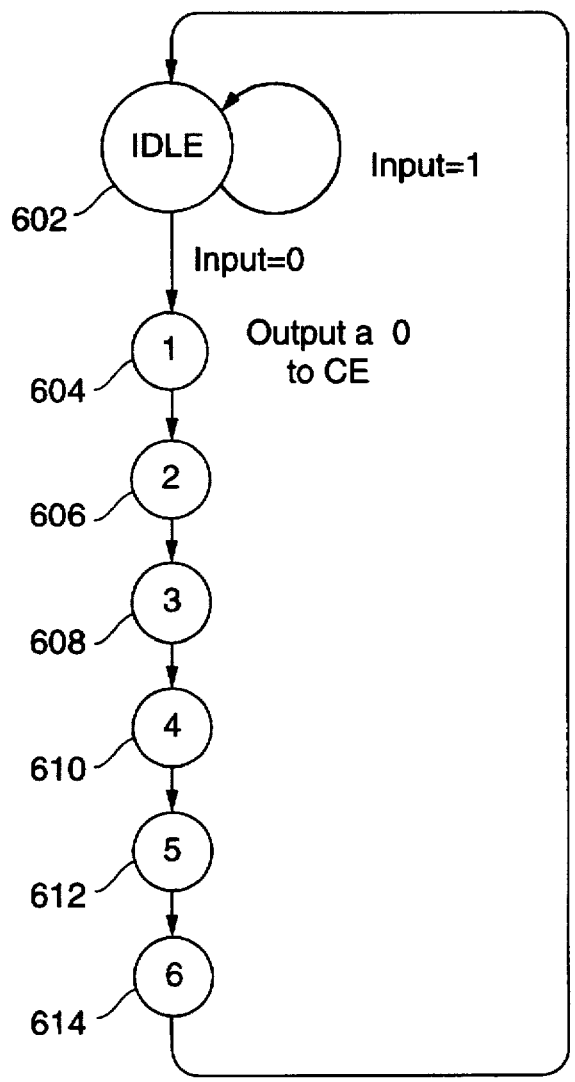

FIG. 5 is a state diagram that illustrates the operation of the state machine 506 in the phase detection circuit shown in FIG. 5.

DETAILED DESCRIPTION

FIG. 2 is a block diagram of a phase detection circuit 300, in accordance with one embodiment of the invention, for detecting the phase of a fast clock 10 relative to a slow clock 12. The fast clock 10 has a frequency which is n times (n=2) the frequency of the slow clock 12, and the fast clock 10 and the slow clock preferably each have a 50% duty cycle. FIG. 3 is a timing diagram that illustrates the timing of the circuit 300.

Referring now to FIGS. 2 and 3, a pulse generation circuit 302 receives the fast clock 10 and generates a pulse signal 14 in response thereto. The pulse signal 14 includes a train of pulses (designated by 16a, 16b and 16c in FIG. 3) that correspond to every $n^{th}$ rising edge of the fast clock 10 (i.e., at the frequency of the slow clock signal 10) and having a phase, relative to the slow clock signal 10, that is selectable in response to a pulse generation control signal 18. Each pulse has a duty cycle that is a whole clock cycle of the fast clock 10.

The pulse signal 14 is provided to a pulse latch circuit 304, and the pulse latch circuit 304 samples a portion of the pulse signal 14 in response to rising edges of the slow clock 12 to generate a latched pulse signal 20. The latched pulse signal 20 is provided to a pulse generation control circuit 306. The pulse generation control circuit 306 determines if the pulse latch circuit 304 sampled one of the pulses, 16a through 16c, of the pulse signal 14. If not, then the pulse generation control circuit 306 controls the pulse generation circuit 302, via the pulse generation control signal 18, to select the generated pulse signal 14 to have a different phase, relative to the slow clock signal 12. For those circuits that use the fast clock 10, the pulses of the pulse signal 14 provide an indication of which rising edges of the fast clock 10 match the rising edges of the slow clock 12.

FIG. 4 schematically illustrates a detailed embodiment 500 of the phase detection circuit 300. Referring to FIG. 4, flip-flops 501, 502 and 503 cycle through a positive pulse to pulse signal output 520 of flip-flop 502. At reset, flop 501 outputs a high level at its q output, and flops 502 and 503 output a low level at their q outputs. This sequence of ones and zeros ("the pulse signal") is cycled through the loop of flip-flops 501, 502 and 503 in response to rising edges of the fast clock 10.

The pulse signal output 520 of flip-flop 502 is provided to the data input of flip-flop 504 as a delayed pulse signal, via a delay line 507. The delay line 507 is provided to satisfy setup and hold times of the flip-flop 504. Flip-flop 507 clocks the delayed pulse signal in response to rising edges of the slow clock 12. That is, if the delayed pulse signal provided from delay line 507 has a low level at the rising edge of the slow clock 12, flip-flop 504 clocks in a low level. Conversely, if the delayed pulse signal provided from delay line 507 has a high level at the rising edge of the slow clock 12, flip-flop 504 clocks in a high level. As a result, the output of flip-flop 504 will stay at a continuous high level if the relationship between the 1 cycling through flip-flops 501, 502 and 503, and the slow clock 12, is as desired. Otherwise, the output of flip-flop 504 will be at a low level.

The output of the flop 504 is provided to a data input of flip-flop 505 via a delay line 508, and the flip-flop 505 clocks the signal provided to its data input to its data output responsive to rising edges of the fast clock 10. The output of the flip-flop 505 is provided to a phase detect state machine 506.

At each rising edge of the fast clock 10, the phase detect state machine 506 detects the state of the signal provided to it. The phase detect state machine 506 operates in accordance with the state diagram shown in FIG. 5. Specifically, if at step 602, the state machine detects a high level at its input, then the state machine idles at step 602. However, if at step 602, the state machine detects a low level at its input, then the state machine advances to step 604, where it outputs a low level signal to the clock enable inputs of flip-flops 501, 502 and 503. This has the effect of "stalling" the flip-flops 501, 502 and 503 from producing a pulse (i.e., ignoring the fast clock signal 10 while the low level signal is provided at the clock input) for one cycle of the fast clock. Then, steps 604 through 614 are "empty states" for allowing the effect of the phase change to settle before monitoring the phase again.

A phase detect signal, provided either from the output of flip-flop 501 or from the output of flip-flop 502 may be provided to the other circuits and latched in a flip-flop clocked by the fast clock. This makes it possible to widely distribute the signal for use and reduces the timing critical nature of the phase detect signal.

Data selector 509 is used to select between various possible ratios between the frequency of the fast clock 10 and the slow clock 12. Specifically, the data selector 509 control where the flip-flops of the of flip-flop chain 501, 502 and 503 are tapped (i.e., from the output of the flip-flop 502 or from the output of the flip-flop 503) for, in the embodiment of FIG. 4, a clock ratio of 2 or 3, respectively.

What is claimed is:

1. A phase detection circuit for detecting a phase relationship between a slow clock signal, characterized by transitions of a given polarity at a first frequency, and a fast clock signal, characterized by transitions of the given polarity at a second frequency that is an integer multiple of the first frequency, comprising:

transition indication circuitry that generates a transition indication signal responsive to transitions, of the given polarity, of the fast clock signal, the transition indication signal including a transition indication corresponding to each $n^{th}$ transition of the given polarity, of the fast clock signal and at a phase that is selectable relative to the slow clock signal in response to a transition indication control signal;

sampling circuitry that samples the transition indication signal responsive to each transition, of the given polarity, of the slow clock signal to generate a transition indication sample;

coincidence determination circuitry, responsive to the transition indication sample signal and to the fast clock signal, that determines if the transition indication coincides with a transition, of the given polarity, of the fast clock signal;

transition indication control circuitry, responsive to the determination by the coincidence determination circuitry and to the fast clock signal that generates the transition indication control signal; and phase relationship indication circuitry that provides an indication of the phase relationship between the slow clock signal and the fast clock signal responsive to the transition indication control signal.

2. The phase detection circuit of claim 1, wherein:

the transition indication corresponding to each $n^{th}$ transition, of the given polarity, of the fast clock signal is a transition indication pulse.

3. The phase detection circuit of claim 2, wherein: the transition indication circuitry includes circuitry that includes n sequential elements configured in a circular fashion such that a pulse is cycled through the n sequential elements responsive to the transitions, of the given polarity, of the fast clock signal and the pulse is provided from a predetermined one of the n sequential elements as the transition indication pulse; and the transition indication circuitry further includes stalling means for stalling the cycling of the pulse through the n sequential elements responsive to the transition the transition indication control signal.

4. The phase detection circuit of claim 3, wherein:

each sequential element of the transition indication circuitry is a flip-flop circuit, each flip-flop circuit having a clock input, a data input and a data output, the clock input of each of the flip-flop circuits coupled to receive the fast clock signal, wherein one of the flip-flop circuits initially generates the pulse; and each flip-flop circuit additionally has a clock enable input coupled to receive the transition indication control signal.

5. The phase detection circuit of claim 1, wherein:

the sampling circuitry is a first latch circuit having a data input coupled to receive the transition indication signal, a clock input coupled to receive the slow clock signal, and a data output; and the coincidence determination circuitry is a second latch circuit having a data input coupled to the data output of the first latch circuit, a clock input coupled to receive the fast clock signal, and a data output coupled to provide the transition indication signal.

6. The phase detection circuit of claim 2, wherein the transition indication control circuitry is a state machine that operates responsive to the transition indication signal, wherein when the state machine is in a sampling state:

the state machine idles when the transition indication signal indicates that transition indication coincides with a transition, of the given polarity, of the fast clock signal; and otherwise the state machine generates the transition indication control signal having a stalling suite to control the stalling means to stall the cycling of the pulse through the n sequential elements.

7. The phase detection circuit of claim 6, wherein when the state machine generates the transition indication control signal having a stalling state, the state machine generates the transition indication control signal having the stalling state for a predetermined number of cycles of the fast clock.

8. A method of providing a phase detection circuit for detecting a phase relationship between a slow clock signal, characterized by transitions of a given polarity at a first frequency, and a fast clock signal, characterized by transitions of the given polarity at a second frequency that is an integer multiple of the first frequency, comprising:

providing transition indication circuitry that generates a transition indication signal responsive to transitions, of the given polarity, of the fast clock signal, the transition indication signal including a transition indication corresponding to each $n^{th}$ transition, of the given polarity of the fast clock signal and at a phase that is selectable relative to the slow clock signal in response to a transition indication control signal;

providing sampling circuitry that samples the transition indication signal responsive to each transition, of the given polarity, of the slow clock signal to generate a transition indication sample;

providing coincidence determination circuitry, responsive to the transition indication sample signal and to the fast clock signal, that determines if the transition indication coincides with a transition, of the given polarity, of the fast clock signal;

providing transition indication control circuitry, responsive to the determination by the coincidence determination circuitry, and to the fast clock signal that generates the transition indication control signal; and providing phase relationship indication circuitry that provides an indication of the phase relationship between the slow clock signal and the fast clock signal responsive to the transition indication control signal.

9. The method of claim 8, wherein:

the transition indication corresponding to each $n^{th}$ transition, of the given polarity, of the fast clock signal is a transition indication pulse.

10. The method of claim 9, wherein:

the transition indication circuitry provided in the transition indication circuit providing step includes circuitry that includes n sequential elements configured in a circular fashion such that a pulse is cycled through the n sequential elements responsive to the transitions, of the given polarity, of the fast clock signal and the pulse is provided from a predetermined one of the n sequential elements as the transition indication pulse; and the transition indication circuitry provided in the transition indication circuit providing step further includes stalling means for stalling the cycling of the pulse through the n sequential elements responsive to the transition indication control signal.

11. The method of claim 10, wherein:

each sequential element of the transition indication circuitry provided in the transition indication circuitry providing step is a flip-flop circuit, each flip-flop circuit having a clock input, a data input and a data output, the clock input of each of the flip-flop circuits coupled to receive the second clock signal, wherein one of the flip-flop circuits initially generates the pulse; and each flip-flop circuit additionally has a clock enable input coupled to receive the transition indication control signal.

12. The method of claim 8, wherein:

the sampling circuitry provided in the sampling circuitry providing step is a first latch circuit having a data input coupled to receive the transition indication signal, a clock input coupled to receive the first clock signal, and a data output; and the coincidence determination circuitry provided in the coincidence determination circuitry providing step is a second latch circuit having a data input coupled to the data output of the first latch circuit, a clock input coupled to receive the second clock signal, and a data output coupled to provide the transition indication signal.

13. The method of claim 9, wherein the transition indication control circuitry provided in the transition indication control circuitry providing step is a state machine that operates responsive to the transition indication signal, wherein when the state machine is in a sampling state:

the state machine idles when the transition indication signal indicates that transition indication coincides with a transition, of the given polarity, of the second clock signal; and, otherwise the state machine generates the transition indication control signal having a stalling state to control the stalling means to stall the cycling of the pulse through the n sequential elements.

14. The method of claim 13, wherein when the state machine provided in the transition indication control circuitry providing step generates the transition indication control signal having a stalling state, the state machine generates the transition indication control signal having the stalling state for a predetermined number of cycles of the second clock.

\* \* \* \* \*

UNITED STATES PATENT AND TRADEMARK OFFICE
CERTIFICATE OF CORRECTION

PATENT NO. : 5,703,502
DATED : December 30, 1997
INVENTOR(S) : Grewal et al.

It is certified that error appears in the above-identified patent and that said Letters Patent is hereby corrected as shown below:

In col. 4 at lines 17-18, please delete the second occurrence of "the transition"; and in col. 4 at line 48, please change the word "suite" to --state--.

Signed and Sealed this

Twenty-sixth Day of May, 1998

Attest:

BRUCE LEHMAN

Attesting Officer

Commissioner of Patents and Trademarks